US008373473B2

(12) United States Patent
Cheng et al.

(10) Patent No.: US 8,373,473 B2
(45) Date of Patent: Feb. 12, 2013

(54) DUAL-LOOP PHASE LOCK LOOP

(75) Inventors: Wei-Chuan Cheng, Taipei (TW); Jiann-Chyi Sam Shieh, San Jose, CA (US)

(73) Assignee: Etron Technology, Inc., Hsinchu (TW)

( * ) Notice: Subject to any disclaimer, the term of this patent is extended or adjusted under 35 U.S.C. 154(b) by 47 days.

(21) Appl. No.: 13/177,568

(22) Filed: Jul. 7, 2011

(65) Prior Publication Data

US 2012/0019294 A1 Jan. 26, 2012

Related U.S. Application Data

(60) Provisional application No. 61/365,782, filed on Jul. 20, 2010.

(30) Foreign Application Priority Data

Feb. 10, 2011 (TW) ............................ 100104382 A

(51) Int. Cl.
*H03L 7/06* (2006.01)

(52) U.S. Cl. ....................................... 327/158; 327/149

(58) Field of Classification Search .................. 327/149, 327/158

See application file for complete search history.

(56) References Cited

U.S. PATENT DOCUMENTS 6,489,851 B1 * 12/2002 Miyada et al. .................. 331/11
6,914,465 B2 * 7/2005 Kiyose et al. ................. 327/156
6,993,300 B2 * 1/2006 Luo et al. ...................... 455/108
7,065,025 B2 * 6/2006 Kiyose ....................... 369/53.34
7,091,759 B2 * 8/2006 Sowlati et al. ................ 327/157
7,212,051 B1 * 5/2007 Zhu et al. ...................... 327/156
7,224,213 B2 * 5/2007 Zhu et al. ...................... 327/554
7,355,463 B2 * 4/2008 Sowlati et al. ................ 327/157
7,595,671 B2 * 9/2009 Watanabe ..................... 327/156
7,786,771 B2 * 8/2010 Tsai et al. ..................... 327/156
7,791,378 B1 * 9/2010 Sutardja et al. ................. 327/12
8,026,742 B1 * 9/2011 Sutardja et al. ................. 327/12
2003/0203724 A1 * 10/2003 Luo et al. ...................... 455/147
2004/0062161 A1 * 4/2004 Kiyose et al. .............. 369/47.28
2004/0095196 A1 * 5/2004 Maxim et al. ................... 331/17
2005/0062550 A1 * 3/2005 Melanson ....................... 331/17
2005/0264369 A1 * 12/2005 Sowlati et al. .................. 331/17
2006/0208778 A1 * 9/2006 Sowlati et al. ................ 327/157
2007/0018736 A1 * 1/2007 Sohn et al. ...................... 331/16
2009/0111408 A1 * 4/2009 Rodal ........................ 455/182.3
2012/0019294 A1 * 1/2012 Cheng et al. .................. 327/157

* cited by examiner

*Primary Examiner* — Adam Houston
(74) *Attorney, Agent, or Firm* — Winston Hsu; Scott Margo

(57) ABSTRACT

A dual-loop phase lock loop includes a phase frequency detector, a first charge pump, a second charge pump, a first capacitor, a filter, a first adder, a voltage controlled delay line, and a frequency divider. The phase frequency detector is used for outputting a switch signal according to a reference clock and a divided feedback clock. The first charge pump and the first capacitor are used for generating a coarse control voltage according to the switch signal. The second charge pump, the filter, and the first adder are used for generating a fine control voltage according to the switch signal and the coarse control voltage. The voltage controlled delay line is used for outputting a feedback clock according to the coarse control voltage and the fine control voltage. The frequency divider is used for dividing the feedback clock to output the divided feedback clock.

11 Claims, 4 Drawing Sheets

DUAL-LOOP PHASE LOCK LOOP

CROSS REFERENCE TO RELATED APPLICATIONS

This application claims the benefit of U.S. Provisional Application No. 61/365,782, filed on Jul. 20, 2010 and entitled "Novel Scheme of Low Jitter, High Speed Dual-loop Phase-lock-loop Suitable for USB3.0 and PCIE Series Application," the contents of which are incorporated herein by reference.

BACKGROUND OF THE INVENTION

1. Field of the Invention

The present invention is related to a dual-loop phase lock loop, and particularly to a dual-loop phase lock loop that can generate a coarse control voltage and a fine control voltage to adjust a feedback clock of the dual-loop phase lock loop according to currents from different current sources.

2. Description of the Prior Art

Please refer to FIG. 1. FIG. 1 is a diagram illustrating a dual-loop phase lock loop 100 according to the prior art. The dual-loop phase lock loop 100 utilizes a coarse tune loop with a large gain to adjust an oscillator frequency shift varied with a process, a voltage, and a temperature, and a fine tune loop with a small gain to adjust performance parameters of the dual-loop phase lock loop 100, such as phase noise, random jitter, and loop bandwidth. Therefore, compared to a single-loop phase lock loop, the dual-loop phase lock loop 100 has lower phase noise and random jitter.

However, as shown in FIG. 1, in the dual-loop phase lock loop 100, a capacitor $C_2$ is large for providing a stable zero. In addition, the coarse tune loop and the fine tune loop of the dual-loop phase lock loop 100 have different control voltages, respectively, and the dual-loop phase lock loop 100 has a very complex filter. Therefore, it is difficult to overcome the above mentioned disadvantages for a designer.

SUMMARY OF THE INVENTION

An embodiment provides a dual-loop phase lock loop. The dual-loop phase lock loop includes a phase frequency detector, a first charge pump, a second charge pump, a first capacitor, a filter, a first adder, a voltage control delay line, and a frequency divider. The phase frequency detector is used for generating a switch signal according to a difference between a reference clock and a divided feedback clock. The phase frequency detector has a first input terminal for receiving the reference clock, a second input terminal for receiving the divided feedback clock, and an output terminal for outputting the switch signal. The first charge pump is used for generating a coarse control voltage according to the switch signal. The first charge pump has a first terminal coupled to the output terminal of the phase frequency detector for receiving the switch signal, a second terminal for receiving the first voltage, and a third terminal for outputting the coarse control voltage. The second charge pump is used for generating a pre-fine control voltage according to the switch signal. The second charge pump has a first terminal for receiving the switch signal, a second terminal for receiving the first voltage, a third terminal for outputting the pre-fine control voltage. The first capacitor has a first terminal coupled to the third terminal of the first charge pump, and a second terminal coupled to ground. The filter is used for filtering a high frequency component of the pre-fine control voltage. The filter has a first terminal coupled to the third terminal of the second charge pump, and a second terminal coupled to the ground. The first adder is used for generating a fine control voltage according to the pre-fine control voltage and the coarse control voltage. The first adder has a first terminal coupled to the third terminal of the first charge pump for receiving the coarse control voltage, a second terminal coupled to the third terminal of the second charge pump for receiving the pre-fine control voltage, and a third terminal for outputting the fine control voltage. The voltage control delay line has a first input terminal coupled to the third terminal of the first charge pump for receiving the coarse control voltage, a second input terminal coupled to the third terminal of the first adder for receiving the fine control voltage, and an output terminal for outputting a feedback clock. The frequency divider is coupled to the voltage control delay line and the phase frequency detector for dividing the feedback clock to output the divided feedback clock.

The present invention provides a dual-loop phase lock loop. The dual-loop phase lock loop utilizes a first current source and a second current source to amplify an equivalent value of a first capacitor, where the first capacitor provides a stable zero and a coarse control voltage to the dual-loop phase lock loop. In addition, the dual-loop phase lock loop generates a fine control voltage by the parallel combination of a second capacitor and a resistor, and the coarse control voltage. Thus, the present invention has advantages described as follows: the present invention does not require a digital calibration circuit, and an LC tank; an area of the first capacitor of the present invention is smaller than an area of a capacitor of a traditional analog dual-loop phase lock loop; because the present invention has a simple filter, and a coarse voltage control unit and a fine voltage control unit of the present invention have the same control voltage, complexity of debugging and testing can be reduced; because a feed forward gain of the fine voltage control unit is lower, a low frequency phase noise generated by a crystal oscillator can not be amplified, resulting in the present invention meeting a low jitter requirement.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
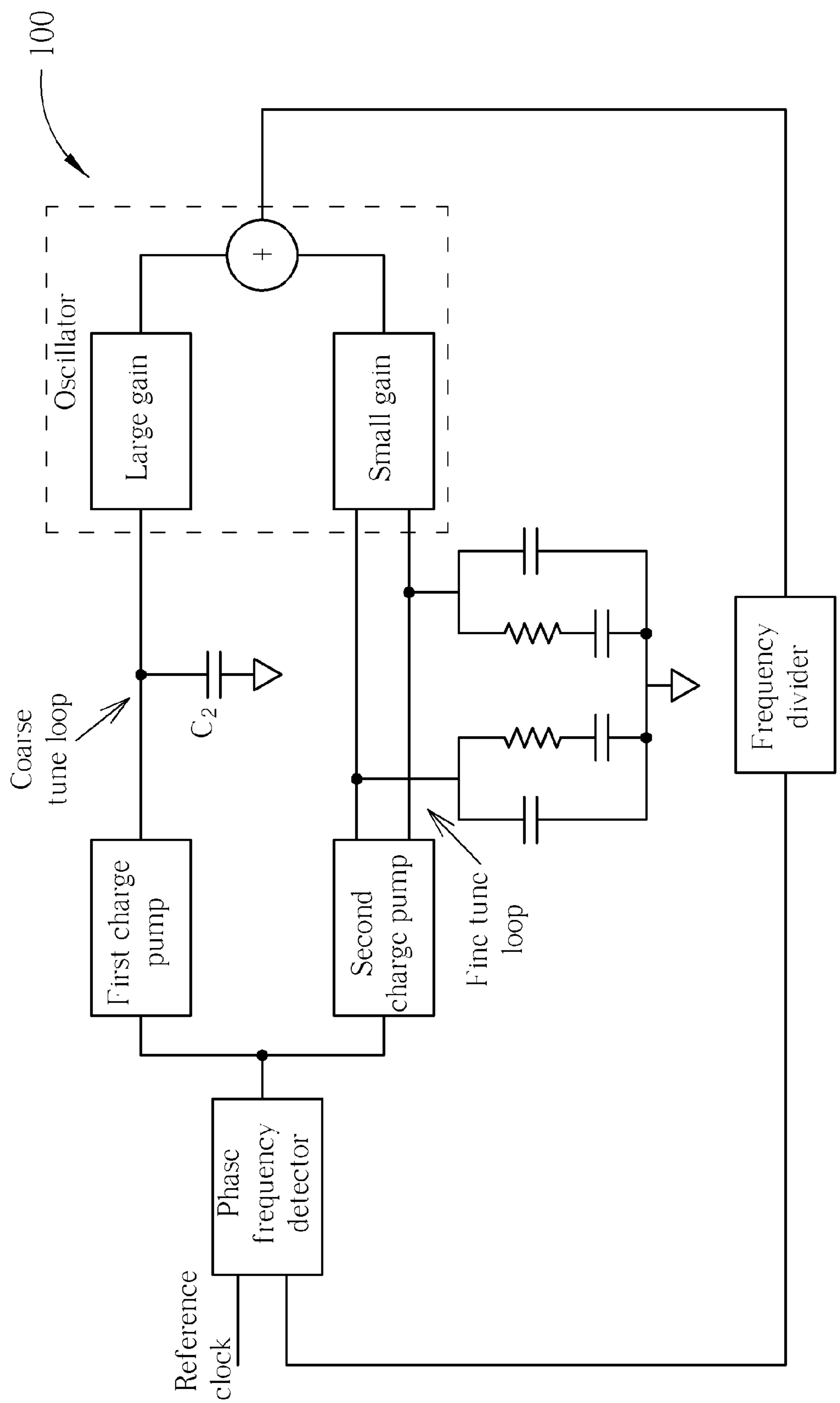
FIG. 1 is a diagram illustrating a dual-loop phase lock loop according to the prior art.
Figure 2:
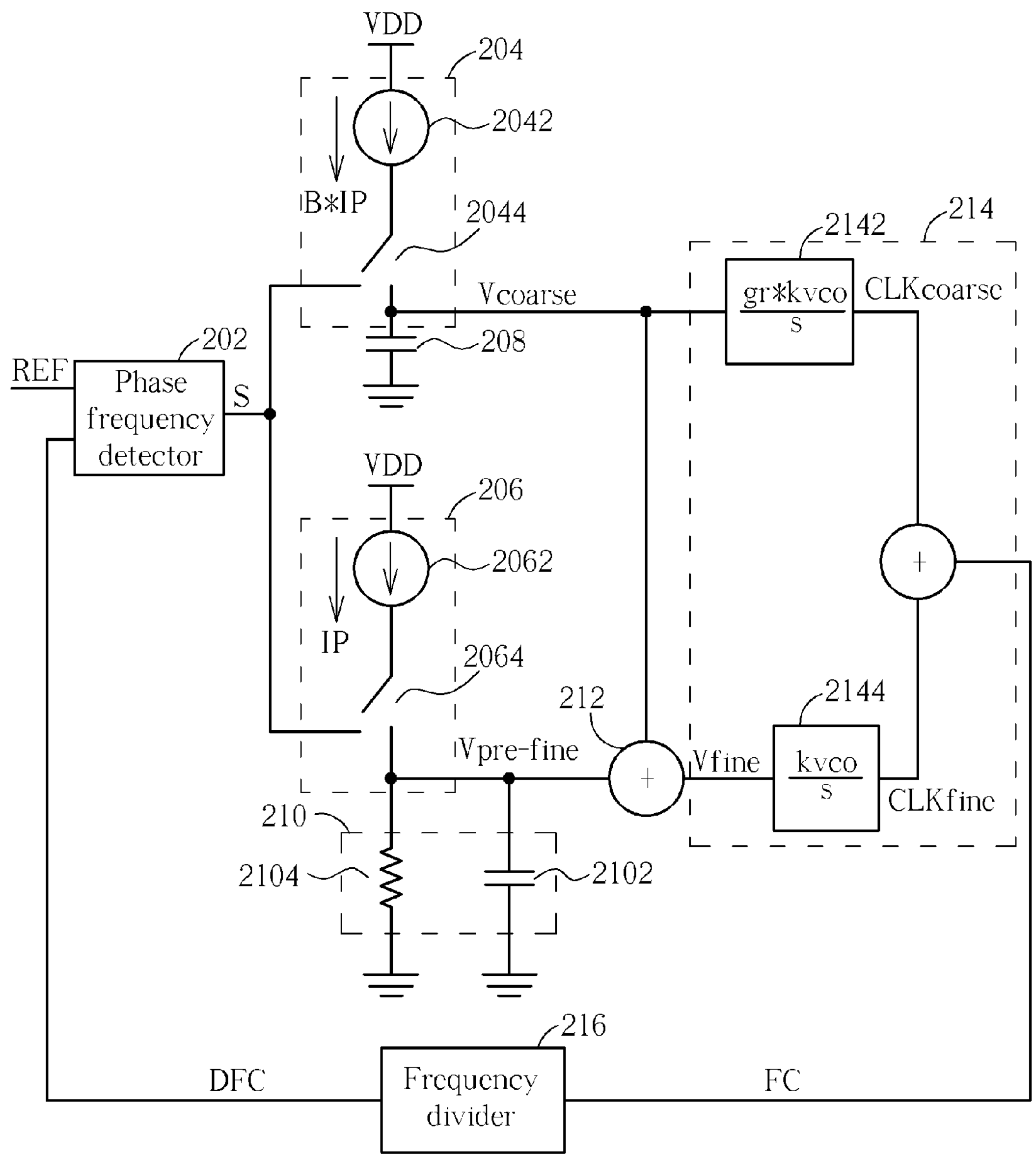
FIG. 2 is a diagram illustrating a dual-loop phase lock loop according to an embodiment.

Please refer to FIG. 2. FIG. 2 is a diagram illustrating a dual-loop phase lock loop 200 according to an embodiment. The dual-loop phase lock loop 200 includes a phase frequency detector 202, a first charge pump 204, a second charge pump 206, a first capacitor 208, a filter 210, a first adder 212, a voltage control delay line 214, and a frequency divider 216. The phase frequency detector 202 has a first input terminal for receiving a reference clock REF, a second input terminal for receiving a divided feedback clock DFC, and an output terminal for outputting a switch signal S. The phase frequency detector 202 is used for generating the switch signal S according to a difference between the reference clock REF and the divided feedback clock DFC. The first charge pump 204 has a first terminal coupled to the output terminal of the phase frequency detector 202 for receiving the switch signal S, a second terminal for receiving a first voltage VDD, and a third terminal for outputting a coarse control voltage Vcoarse. The second charge pump 206 has a first terminal coupled to the output terminal of the phase frequency detector 202 for receiving the switch signal S, a second terminal for receiving the first voltage VDD, and a third terminal for outputting a pre-fine control voltage Vpre-fine. The first capacitor 208 has a first terminal coupled to the third terminal of the first charge pump 204, and a second terminal coupled to ground. The filter 210 is used for filtering a high frequency component of the pre-fine control voltage Vpre-fine. The filter 210 has a first terminal coupled to the third terminal of the second charge pump 206, and a second terminal coupled to the ground. The first adder 212 has a first terminal coupled to the third terminal of the first charge pump 204 for receiving the coarse control voltage Vcoarse, a second terminal coupled to the third terminal of the second charge pump 206 for receiving the pre-fine control voltage Vpre-fine, and a third terminal for outputting a fine control voltage Vfine. The voltage control delay line 214 has a first input terminal coupled to the third terminal of the first charge pump 204 for receiving the coarse control voltage Vcoarse, a second input terminal coupled to the third terminal of the first adder 212 for receiving the fine control voltage Vfine, and an output terminal for outputting a feedback clock FC, where the feedback clock FC is a differential clock. The voltage control delay line 214 includes a coarse voltage control unit 2142, a fine voltage control unit 2144, and a second adder 2146. The coarse voltage control unit 2142 has a coarse gain function (gr*Kvco)/s for generating a coarse clock control signal CLKcoarse according to the coarse control voltage Vcoarse. The fine voltage control unit 2144 has a fine gain function Kvco/s for generating a fine clock control signal CLKfine according to the fine control voltage Vfine. The voltage control delay line 214 generates the feedback clock FC according to a sum of the coarse clock control signal CLKcoarse and the fine clock control signal CLKfine generated by the second adder 2146, where the coarse gain function (gr*Kvco)/s is a first predetermined multiple (gr) of the fine gain function Kvco/s, and gr is much larger than 1. The frequency divider 216 is coupled to the voltage control delay line 214 and the phase frequency detector 202 for dividing the feedback clock FC to output the divided feedback clock DFC.

The first charge pump 204 includes a first current source 2042 and a first switch 2044. The first current source 2042 has a first terminal coupled to the second terminal of the first charge pump 204, and a second terminal. The first switch 2044 has a first terminal coupled to the first terminal of the first charge pump 204, a second terminal coupled to the second terminal of the first current source 2042, and a third terminal coupled to the third terminal of the first charge pump 204. When the first charge pump 204 receives the switch signal S, the first current source 2042 charges the first capacitor 208 to determine the coarse control voltage Vcoarse according to a first current B*IP. The coarse control voltage Vcoarse is determined by equation (1):

$$Vcoarse = \frac{B*IP}{s*Cz} \tag{1}$$

where Cz is a value of the first capacitor 208.

The second charge pump 206 includes a second current source 2062 and a second switch 2064. The second current source 2062 has a first terminal coupled to the second terminal of the second charge pump 206, and a second terminal. The second switch 2064 has a first terminal coupled to the first terminal of the second charge pump 206, a second terminal coupled to the second terminal of the second current source 2062, and a third terminal coupled to the third terminal of the second charge pump 206. The filter 210 includes a second capacitor 2102 and a resistor 2104. The second capacitor 2102 has a first terminal coupled to the first terminal of the filter 210, and a second terminal coupled to the ground. The resistor 2104 has a first terminal coupled to the first terminal of the filter 210, and a second terminal coupled to the ground. When the second charge pump 206 receives the switch signal S, the second current source 2062 charges the second capacitor 2102 to determine the pre-fine control voltage Vpre-fine according to a second current IP. The pre-fine control voltage Vpre-fine is determined by equation (2):

$$Vpre\text{-}fine + IP*\left(\frac{1}{s*Cp} \,//\, Rp\right) \tag{2}$$

where Cp is a value of the second capacitor 2102, Rp is a value of the resistor 2104, and the value Cz of the first capacitor 208 is much larger than the value Cp of the second capacitor 2102.

After the first adder 212 receives the coarse control voltage Vcoarse and the pre-fine control voltage Vpre-fine, the first adder 212 generates and outputs the fine control voltage Vfine according to the coarse control voltage Vcoarse and the pre-fine control voltage Vpre-fine. The fine control voltage Vfine is determined by equation (3):

$$\begin{aligned} Vfine &= Vcoarse + IP*\left(\frac{1}{s*Cp} \,//\, Rp\right) \\ &= IP\frac{B + s*(Rp*Cz + B*Rp*Cp)}{s*Cz*(1 + s*Cp*Rp)} \end{aligned} \tag{3}$$

As shown in equation (3), B is a ratio of the first current B*IP to the second current IP. That is to say, the first current B*IP is a second predetermined multiple (B) of the second current IP, where the second predetermined multiple B is much less than 1, and the second predetermined multiple B is an inverse of the first predetermined multiple gr.

Therefore, the coarse voltage control unit 2142 of the voltage control delay line 214 can generate a first open-loop gain A1 according to the coarse control voltage Vcoarse and the coarse gain function (gr*Kvco)/s, where the first open-loop gain A1 is determined by equation (4):

$$\begin{aligned} A1 &= Vcoarse*\left(2*\pi*gr*\frac{Kvco}{s}\right) \\ &= 2*\pi*IP*Kvco*\frac{B*gr}{s^2*Cz} \end{aligned} \tag{4}$$

The fine voltage control unit 2144 of the voltage control delay line 214 can generate a second open-loop gain A2 according to the fine control voltage Vfine and the fine gain function Kvco/s, where the second open-loop gain A2 is determined by equation (5):

$$A2 = Vfine*\left(2*\pi*\frac{Kvco}{s}\right) = 2*\pi*IP*Kvco*\frac{B+s*Rp*(Cz+B*Cp)}{s^2*Cz*(1+Cp*Rp)} \quad (5)$$

Because an open-loop gain A of the dual-loop phase lock loop 200 is a sum of the first open-loop gain A1 and the second open-loop gain A2, the open-loop gain A of the voltage control delay line 214 is determined by equation (6):

$$A = 2*\pi*IP*Kvco*\frac{(B+B*gr)+s*\left(\begin{array}{c}Rp*Cz+B*Rp*\\Cp+B*gr*Rp*Cp\end{array}\right)}{s^2*Cz*(1+Cp*Rp)} \quad (6)$$

Three poles P1, P2, P3 and a zero Z1 of the dual-loop phase lock loop 200 are generated by equation (6), equation (7), and equation (8):

$$P1 = P2 = 0 \quad (7)$$

$$P3 = \frac{-1}{Rp*Cp}$$

$$Z1 = -B*\frac{1+gr}{Rp*[Cz+B*Cp*(1+gr)]} \quad (8)$$

Because the first predetermined multiple gr is much larger than 1, the second predetermined multiple B is the inverse of the first predetermined multiple gr, and the value Cz of the first capacitor 208 is much larger than the value Cp of the second capacitor 2102, equation (8) can be simplified to equation (9):

$$Z1 \cong \frac{-1}{Rp*Cz} \quad (9)$$

Figure 3:
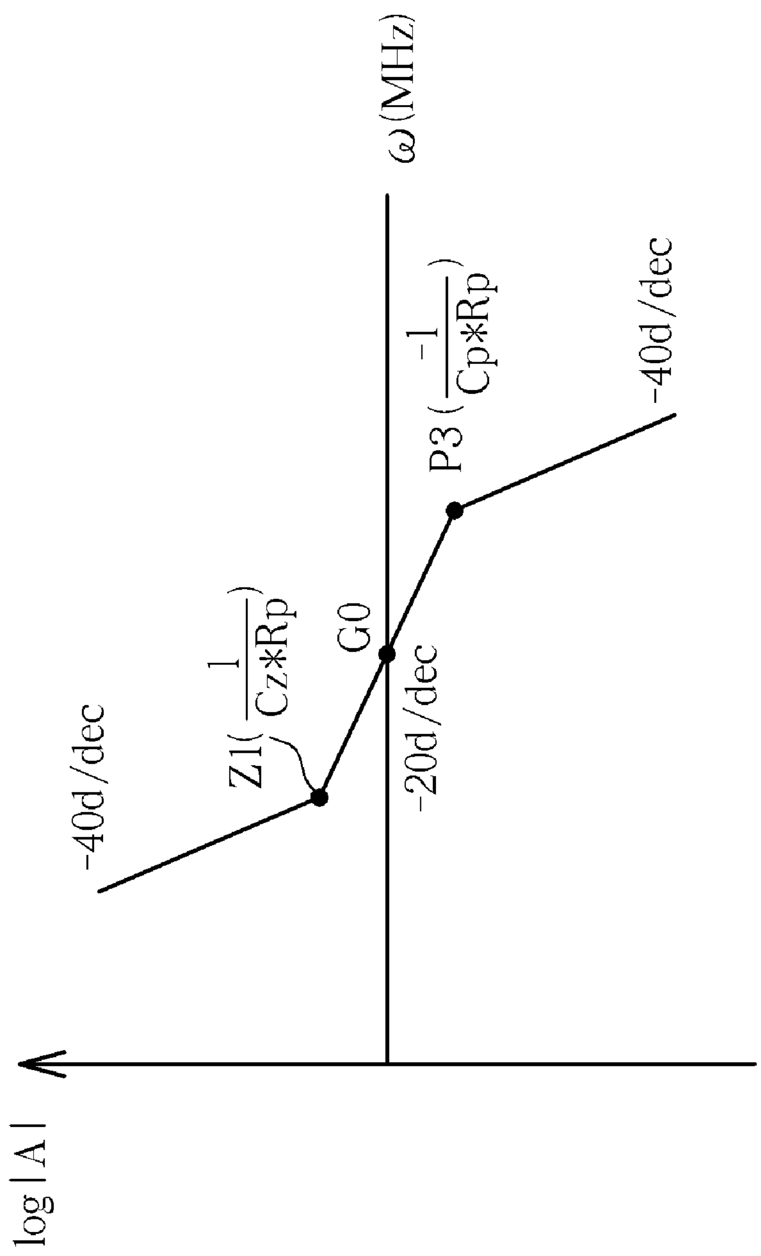
FIG. 3 is a diagram illustrating a bode plot of the open-loop gain of the dual-loop phase lock loop.

Please refer to FIG. 3. FIG. 3 is a diagram illustrating a Bode plot of the open-loop gain A of the dual-loop phase lock loop 200. A vertical axis of the Bode plot of the open-loop gain A is a logarithm corresponding to the open-loop gain A, and a horizontal axis of the Bode plot of the open-loop gain A is ω (a frequency of the feedback clock FC). As shown in FIG. 3, because the zero Z1 is at the left of a zero-crossing point G0 (at the zero-crossing point G0, the logarithm of the open-loop gain A is zero) and the pole P3 is at the right of the zero-crossing point G0, the zero-crossing point G0 is located on a −20 dB/dec line segment. Therefore, the dual-loop phase lock loop 200 is stable. In addition, because the pole P3 and the zero Z1 are determined by equation (7) and equation (9) respectively, locations of the pole P3 and the zero Z1 can be changed by controlling the value Cz of the first capacitor 208 and the value Cp of the second capacitor 2102.

Figure 4:
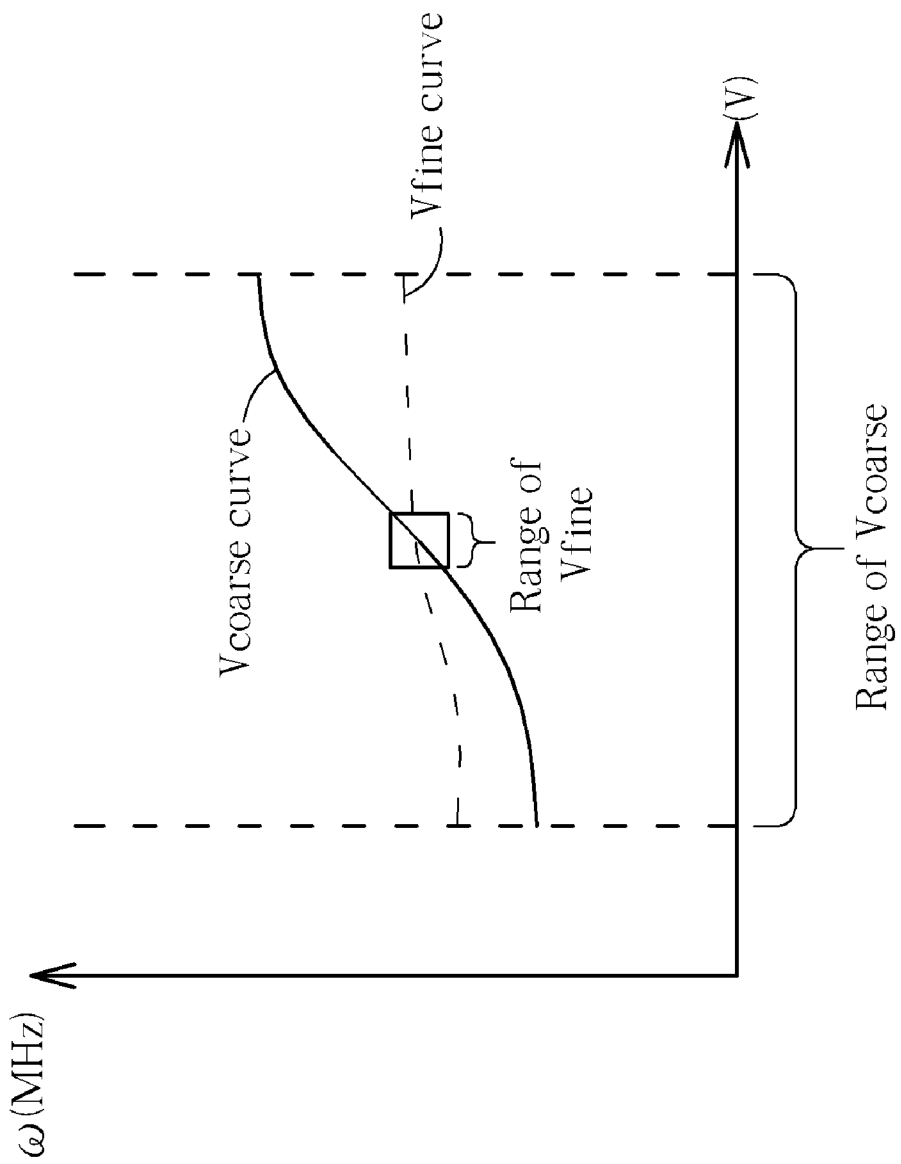
FIG. 4 is a diagram illustrating a relationship between the coarse control voltage and the fine control voltage.

Please refer to FIG. 4. FIG. 4 is a diagram illustrating a relationship between the coarse control voltage Vcoarse and the fine control voltage Vfine. As shown in FIG. 4, a structure of the coarse voltage control unit 2142 is the same as a structure of the fine voltage control unit 2144 for the coarse control voltage Vcoarse to be equal to the fine control voltage Vfine. But, device sizes of the coarse voltage control unit 2142 are different from device sizes of the fine voltage control unit 2144. Therefore, as shown in FIG. 4, a curve slope of the coarse control voltage Vcoarse is the first predetermined multiple gr of a curve slope of the fine control voltage Vfine. In addition, the first predetermined multiple gr can be varied with a design of the dual-loop phase lock loop 200.

To sum up, the dual-loop phase lock loop utilizes the first current source and the second current source to amplify an equivalent value of the first capacitor, where the first capacitor provides the stable zero and the coarse control voltage to the dual-loop phase lock loop. In addition, the dual-loop phase lock loop generates the fine control voltage by the parallel combination of the second capacitor and the resistor, and the coarse control voltage. Thus, the present invention has advantages described as follows: the present invention does not require a digital calibration circuit and an LC tank; an area of the first capacitor of the present invention is smaller than an area of a capacitor of a traditional analog dual-loop phase lock loop; because the present invention has a simple filter, and the coarse voltage control unit and the fine voltage control unit have the same control voltage, complexity of debugging and testing of the present invention can be reduced; because a feed forward gain of the fine voltage control unit is lower, a low frequency phase noise generated by a crystal oscillator cannot be amplified, resulting in the present invention meeting a low jitter requirement.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dual-loop phase lock loop, comprising:

a phase frequency detector for generating a switch signal according to a difference between a reference clock and a divided feedback clock, the phase frequency detector having a first input terminal for receiving the reference clock, a second input terminal for receiving the divided feedback clock, and an output terminal for outputting the switch signal;

a first charge pump having a first terminal coupled to the output terminal of the phase frequency detector for receiving the switch signal, a second terminal for receiving a first voltage, and a third terminal for outputting a coarse control voltage;

a second charge pump having a first terminal coupled to the output terminal of the phase frequency detector for receiving the switch signal, a second terminal for receiving the first voltage, and a third terminal for outputting a pre-fine control voltage;

a first capacitor having a first terminal coupled to the third terminal of the first charge pump, and a second terminal coupled to ground;

a filter for filtering a high frequency component of the pre-fine control voltage, the filter having a first terminal coupled to the third terminal of the second charge pump, and a second terminal coupled to the ground;

a first adder for generating a fine control voltage according to the pre-fine control voltage and the coarse control voltage, the first adder having a first terminal coupled to the third terminal of the first charge pump for receiving the coarse control voltage, a second terminal coupled to the third terminal of the second charge pump for receiving the pre-fine control voltage, and a third terminal for outputting the fine control voltage;

a voltage control delay line having a first input terminal coupled to the third terminal of the first charge pump for receiving the coarse control voltage, a second input terminal coupled to the third terminal of the first adder for receiving the fine control voltage, and an output terminal for outputting a feedback clock; and a frequency divider coupled to the voltage control delay line and the phase frequency detector for dividing the feedback clock to output the divided feedback clock.

2. The phase lock loop of claim 1, wherein the voltage control delay line comprises:

a coarse voltage control unit having a coarse gain function for generating a coarse clock control signal according to the coarse control voltage; and a fine voltage control unit having a fine gain function for generating a fine clock control signal according to the fine control voltage;

wherein the coarse gain function is a first predetermined multiple of the fine gain function.

3. The phase lock loop of claim 2, wherein a first current provided by the first current source is a second predetermined multiple of a second current provided by the second current source, the second predetermined multiple is much less than 1, and the first predetermined multiple is an inverse of the second predetermined multiple.

4. The phase lock loop of claim 1, wherein the filter comprises:

a second capacitor having a first terminal coupled to the first terminal of the filter, and a second terminal coupled to the ground; and a resistor having a first terminal coupled to the first terminal of the filter, and a second terminal coupled to the ground.

5. The phase lock loop of claim 4, wherein a value of the first capacitor is much greater than a value of the second capacitor.

6. The phase lock loop of claim 1, wherein the first charge pump comprises:

a first current source having a first terminal coupled to the second terminal of the first charge pump, and a second terminal; and a first switch having a first terminal coupled to the first terminal of the first charge pump, a second terminal coupled to the second terminal of the first current source, and a third terminal coupled to the third terminal of the first charge pump.

7. The phase lock loop of claim 6, wherein a first current provided by the first current source is a second predetermined multiple of a second current provided by the second current source, the second predetermined multiple is much less than 1, and the first predetermined multiple is an inverse of the second predetermined multiple.

8. The phase lock loop of claim 1, wherein the second charge pump comprises:

a second current source having a first terminal coupled to the second terminal of the second charge pump, and a second terminal; and a second switch having a first terminal coupled to the first terminal of the second charge pump, a second terminal coupled to the second terminal of the second current source, and a third terminal coupled to the third terminal of the second charge pump.

9. The phase lock loop of claim 8, wherein a first current provided by the first current source is a second predetermined multiple of a second current provided by the second current source, the second predetermined multiple is much less than 1, and the first predetermined multiple is an inverse of the second predetermined multiple.

10. The phase lock loop of claim 1, wherein a value of the first capacitor is much greater than a value of the second capacitor.

11. The phase lock loop of claim 1, wherein the feedback clock is a differential clock.

* * * * *